United States Patent
Schingale et al.

(10) Patent No.: US 9,332,640 B2
(45) Date of Patent: May 3, 2016

(54) CONTACT SURFACE ARRANGED ON A CARRIER FOR CONNECTING TO A COUNTER CONTACT SURFACE ARRANGED ON A FURTHER CARRIER, AND DEVICE COMPRISING A CONTACT SURFACE AND A COUNTER CONTACT SURFACE CONNECTED THERETO

(75) Inventors: Angelika Schingale, Regensburg (DE); Frank Baur, Nuremberg (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/113,597

(22) PCT Filed: Apr. 17, 2012

(86) PCT No.: PCT/EP2012/056973
§ 371 (c)(1),
(2), (4) Date: Oct. 24, 2013

(87) PCT Pub. No.: WO2012/146507
PCT Pub. Date: Nov. 1, 2012

(65) Prior Publication Data
US 2014/0048325 A1      Feb. 20, 2014

(30) Foreign Application Priority Data
Apr. 29, 2011   (DE) .......................... 10 2011 075 009

(51) Int. Cl.
*H05K 1/11*    (2006.01)
*H05K 3/32*    (2006.01)
*H05K 1/02*    (2006.01)

(52) U.S. Cl.
CPC ................ *H05K 1/112* (2013.01); *H05K 1/111* (2013.01); *H05K 3/323* (2013.01); *H05K 1/0272* (2013.01);

(Continued)

(58) Field of Classification Search
CPC .......... H01L 21/00; H01L 21/02; H01L 21/56; H01L 21/60; H01L 23/48; H01L 23/52; H01L 23/485; H01L 23/488; H01L 29/40; H01L 24/11; H01L 24/12; H01L 24/16; H01L 24/29; H01L 24/31; H01L 24/81; H01L 24/83; H05K 1/11; H05K 1/14; H05K 1/117; H05K 3/32; H05K 3/36
USPC ............. 174/266; 257/773, 778, 786; 501/19; 428/40.7, 141; 156/298; 349/149; 361/792
See application file for complete search history.

(56) References Cited

U.S. PATENT DOCUMENTS 5,019,944 A    5/1991  Ishii et al.
5,300,340 A *  4/1994  Calhoun et al. .............. 428/40.7
(Continued)

FOREIGN PATENT DOCUMENTS

EP            0330452 A2    8/1989

*Primary Examiner* — Xiaoliang Chen
(74) *Attorney, Agent, or Firm* — Laurence A. Greenberg; Werner H. Stemer; Ralph E. Locher

(57) ABSTRACT

A contact area is provided on a carrier for connection to a mating contact area on a further carrier using an adhesive containing conductive particles. The contact area includes at least one recess forming a drain channel for the adhesive, extending from one edge of the contact area to an opposing edge and having a width being less than an average diameter of the particles. Alternatively, the contact area includes boreholes extending from a main surface to an opposing main surface and having diameters being approximately equal to or smaller than the average diameter of the particles in at least one direction and a cavity is formed in the carrier beneath the contact area. Alternatively, integral moldings forming a turf structure are provided on the contact area and distances between the moldings are equal to or smaller than the average diameter of the particles in at least one direction.

1 Claim, 5 Drawing Sheets

(52) U.S. Cl.
CPC  *H05K 2201/0373* (2013.01); *H05K 2201/0969* (2013.01); *H05K 2201/09663* (2013.01); *H05K 2201/09745* (2013.01); *H05K 2201/09781* (2013.01)

(56) References Cited

U.S. PATENT DOCUMENTS

| | | | | |
|---|---|---|---|---|
| 5,839,188 | A * | 11/1998 | Pommer | 29/830 |
| 5,903,056 | A * | 5/1999 | Canning et al. | 257/773 |
| 6,133,637 | A * | 10/2000 | Hikita et al. | 257/777 |
| 6,246,014 | B1 * | 6/2001 | Pommer | 174/261 |
| 6,344,424 | B1 * | 2/2002 | Goto et al. | 501/19 |
| 6,366,331 | B1 * | 4/2002 | Sakamoto et al. | 349/43 |
| 6,579,744 | B1 * | 6/2003 | Jiang | 438/106 |
| 6,588,672 | B1 * | 7/2003 | Usami | G06K 19/073 235/379 |
| 7,394,659 | B2 | 7/2008 | Colgan et al. | |
| 7,968,803 | B2 * | 6/2011 | Higashitani | H05K 3/384 174/261 |
| 2001/0008169 | A1 * | 7/2001 | Connell et al. | 156/298 |
| 2001/0033355 | A1 * | 10/2001 | Hagiwara | 349/152 |
| 2003/0164919 | A1 * | 9/2003 | Oh et al. | 349/149 |
| 2004/0135258 | A1 | 7/2004 | Ebine | |
| 2005/0098902 | A1 * | 5/2005 | Ho et al. | 257/786 |
| 2006/0108685 | A1 * | 5/2006 | Tsou | H01L 21/563 257/737 |
| 2006/0115927 | A1 * | 6/2006 | Yeo et al. | 438/107 |
| 2007/0268441 | A1 * | 11/2007 | Liu et al. | 349/149 |
| 2008/0283284 | A1 | 11/2008 | Koyama et al. | |
| 2009/0032081 | A1 * | 2/2009 | Saita et al. | 136/244 |
| 2009/0102064 | A1 * | 4/2009 | Sawada et al. | 257/778 |
| 2010/0007033 | A1 * | 1/2010 | Kitae et al. | 257/778 |
| 2010/0032202 | A1 * | 2/2010 | Higashitani | H05K 3/384 174/264 |
| 2010/0085720 | A1 | 4/2010 | Shudo | 361/792 |
| 2010/0116314 | A1 * | 5/2010 | Fukushima | C09J 7/0292 136/244 |
| 2010/0198077 | A1 * | 8/2010 | Ooura | A61B 8/08 600/459 |
| 2011/0122596 | A1 * | 5/2011 | Miyazaki et al. | 361/818 |

* cited by examiner

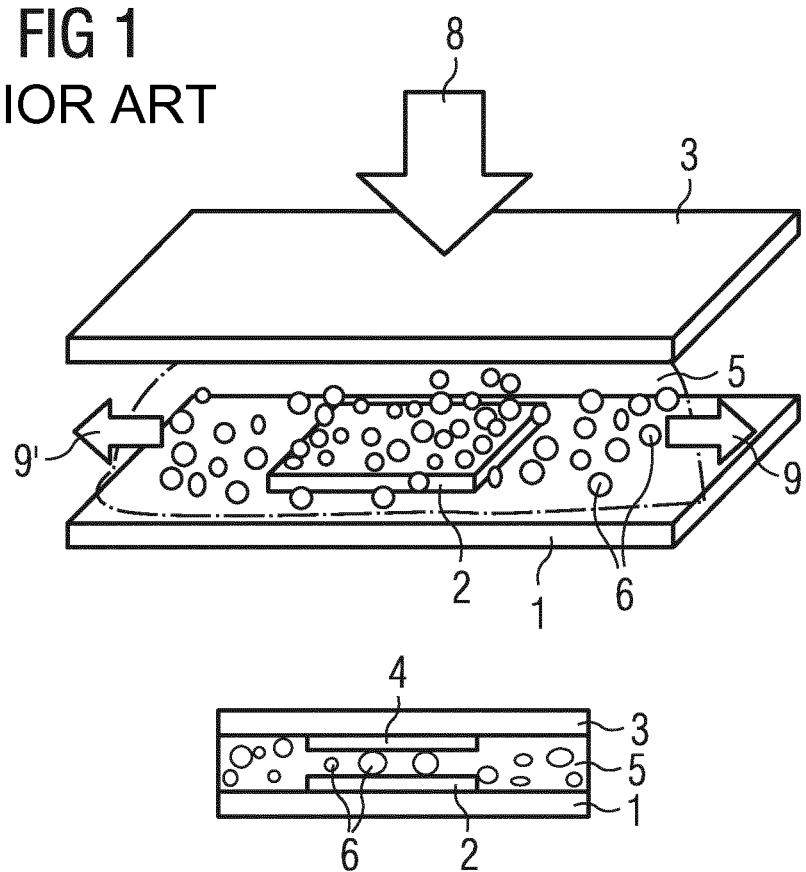

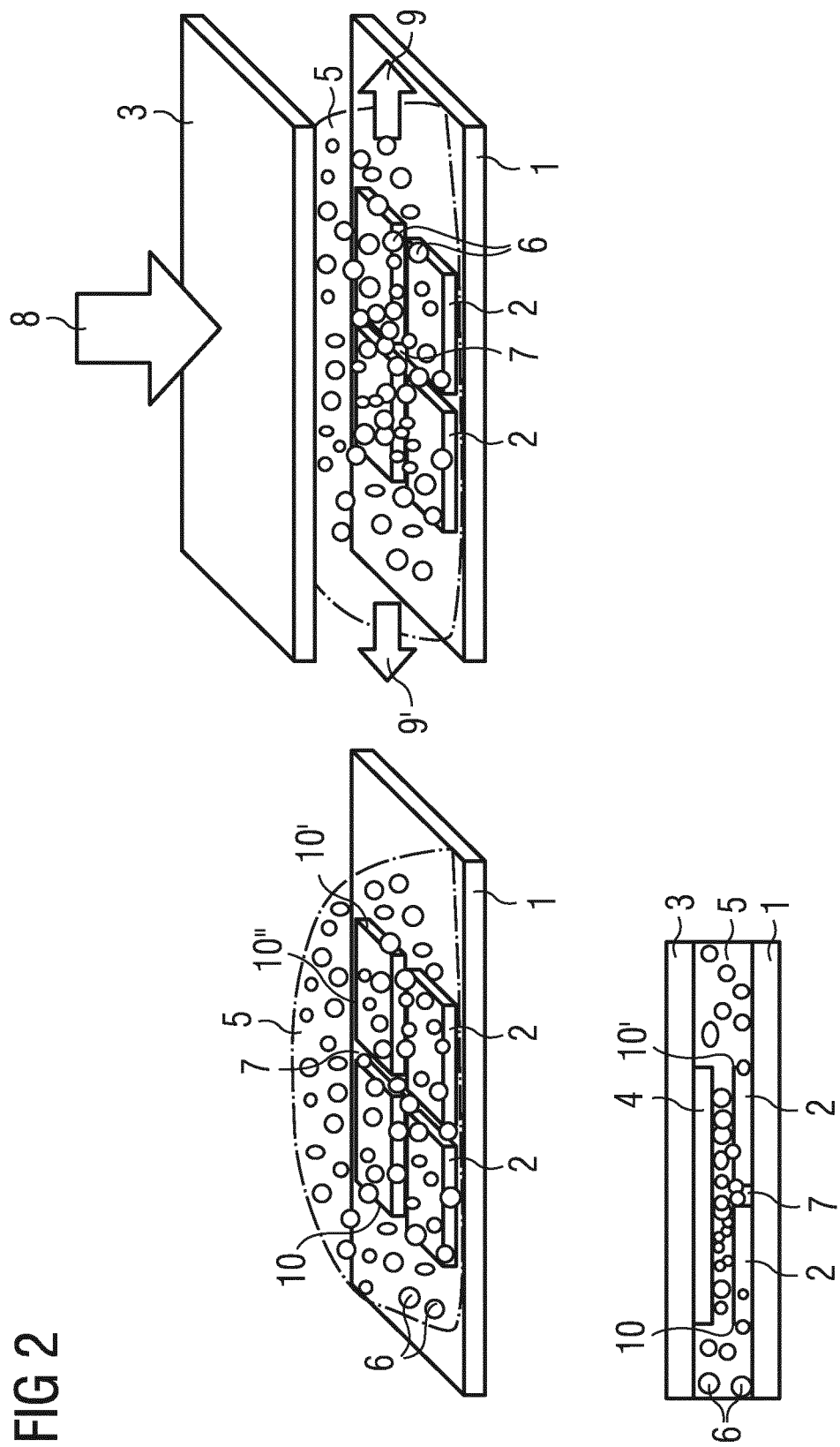

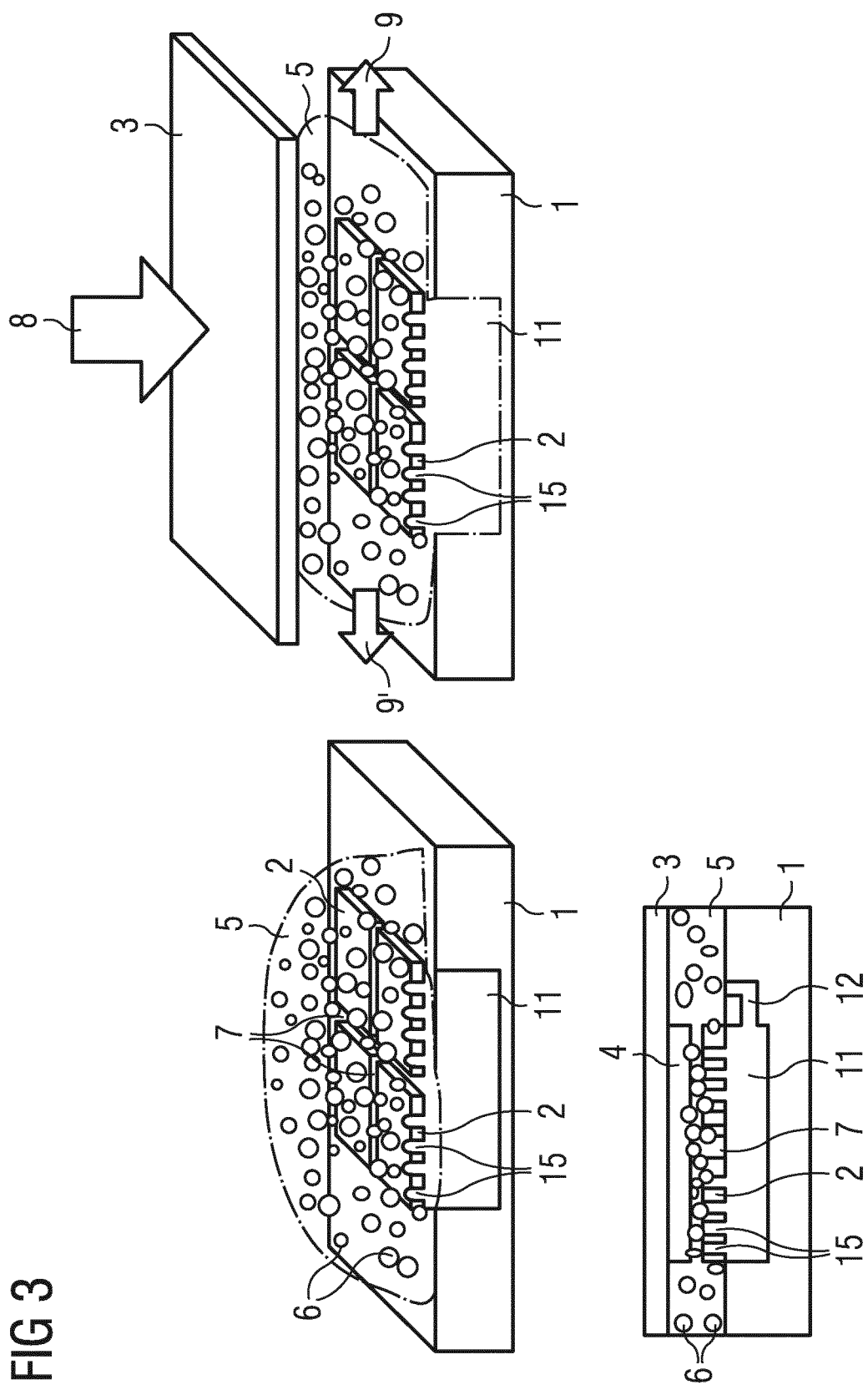

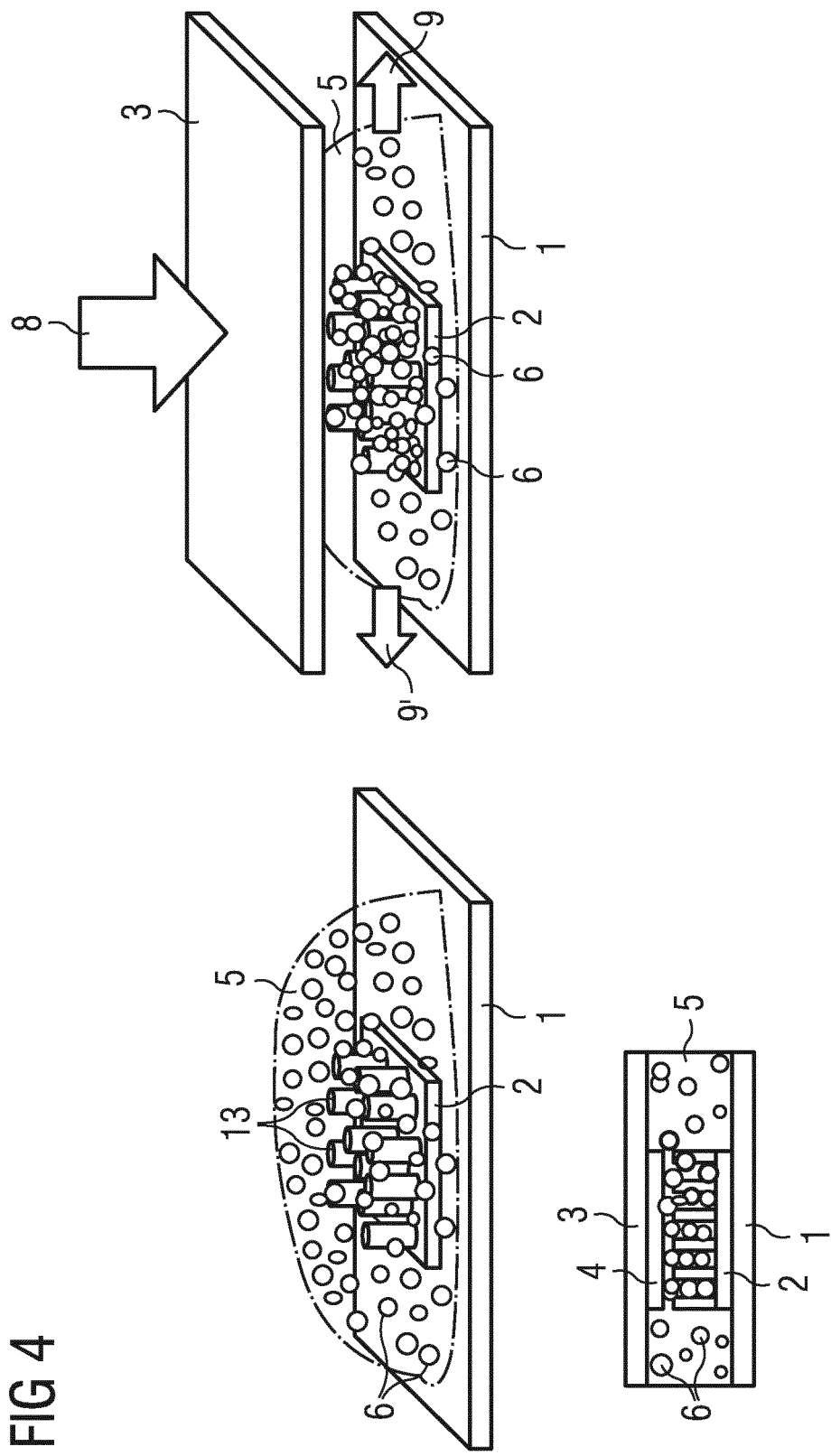

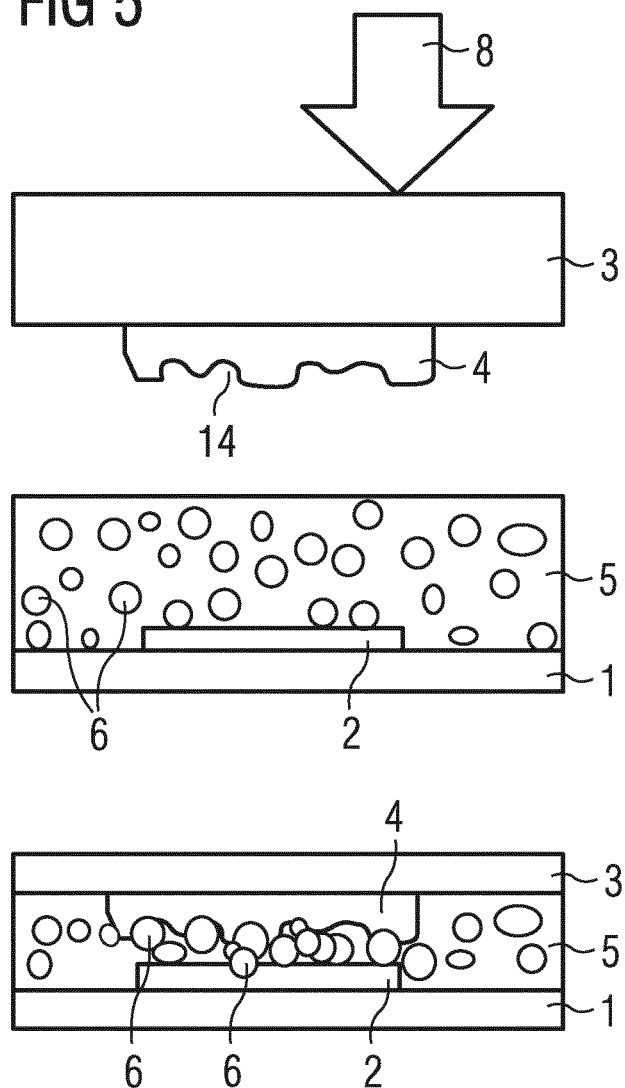

cameras
CONTACT SURFACE ARRANGED ON A CARRIER FOR CONNECTING TO A COUNTER CONTACT SURFACE ARRANGED ON A FURTHER CARRIER, AND DEVICE COMPRISING A CONTACT SURFACE AND A COUNTER CONTACT SURFACE CONNECTED THERETO Contact surface arranged on a carrier for connecting to a counter contact surface arranged on a further carrier, and device comprising a contact surface and a counter contact surface connected thereto

BACKGROUND OF THE INVENTION

Field of the Invention

Electrical and/or electronic components of any type are usually not only mechanically fixed on printed circuit boards, but rather also electrically connected to conductor tracks which are arranged on the carrier, for use in electrical and/or electronic apparatuses. Special contact areas are often provided for this purpose. Particularly simple mounting, in which not only mechanical fixing but rather likewise the electrical connection can be performed in one step, involves the connection of the component to the contact area of the carrier by means of a conductive adhesive, often an anisotropic conductive paste. Said anisotropic conductive paste is often formed with a curable resin which contains conductive particles of identical or else different size and shape.

When the connection is being established, as is schematically illustrated in FIG. 1, the conductive adhesive 5 is applied to the carrier 1 so as to cover the contact area 2 which is arranged there. Representing a component, FIG. 1 shows that a further carrier 3, which has the mating contact area 4, is fitted onto the adhesive 5 and—indicated by a vertical arrow 8—pushed down in order to move the contact area 2 and the mating contact area 4 in relation to one another to such an extent that electrical contact is made by virtue of the conductive particles 6 which are located between them. The horizontal arrows 9, 9' indicate how the adhesive 5 is pushed away from the contact areas 2, 4 by virtue of the carrier 1 and the further carrier 3 being joined. However, in this case, not only the binder, for example the resin of the adhesive 5, but rather likewise the conductive particles 6 which are contained therein are usually pushed away, with the result that the number of conductive particles 6 which are located between the contact areas 2, 4 and therefore the conductivity of the connection between the contact areas 2 and the mating contact area 4 is randomly distributed and cannot be accurately predicted.

In order to avoid this problem, metal connections, such as solder in connection with a so-called underfiller for example, are often used. These connection techniques are often complicated and therefore relatively expensive and/or do not correspond to the usage conditions.

BRIEF SUMMARY OF THE INVENTION

The object of the invention is therefore to improve the conductivity of a connection between the two contact areas by means of a conductive adhesive.

The object is achieved according to one embodiment of the invention as follows:

Accordingly, the contact area, which is arranged on a carrier, for connection to a mating contact area, which is arranged on a further carrier, by means of an adhesive which contains conductive particles has at least one recess which forms a drain channel for the adhesive, extends from one edge of the contact area to an opposite edge and has a width which is approximately equal to or less than the average diameter of the conductive particles. In this way, when the two carriers are joined, the binder of the adhesive can flow away through the recess, while the conductive particles are rather retained by this recess. As a result of the adhesive being pushed into the recess and being routed toward the edges of the contact area in said recess, more conductive particles remain in the region of the contact area and are not swept away to the outside.

In an advantageous development of the invention, a plurality of such recesses which form the drain channels can be provided, it being possible for said recesses to run both in parallel and perpendicularly to one another.

The depth of the recess can be chosen depending on the type of conductive particles and the type of binder of the adhesive. It is particularly advantageous when said recess extends from one main surface of the contact area to the opposite main surface.

In a similarly advantageous refinement of the contact area, the main surface of said contact area, which main surface faces the mating contact area, can be of concave design between a first edge and the opposite edge. In a development, the profile can likewise be of concave design between an edge which runs perpendicularly to said main surface and that edge which is opposite said edge, with the result that the main surface of the contact area, which main surface faces the mating contact area, is presented as a cavity. This advantageously helps the conductive particles remain in the region of the contact area and helps the binder of the adhesive flow away, mainly through the recesses.

In order that the binder of the adhesive flows away mainly through the recesses, the carrier can, in an advantageous development of the invention, have a hollow space beneath the contact area, at least a portion of the binder of the adhesive being pushed into said hollow space.

The hollow space can additionally be connected to an outer face of the carrier by means of a duct which is formed in the carrier, with the result that the adhesive can flow away again.

In an alternative design of the contact area, said contact area has holes which extend from one main surface to the opposite main surface and of which the diameter is approximately equal to or less than the average diameter of the conductive particles in at least one direction, wherein a hollow space is formed beneath the contact area in the carrier, said hollow space optionally being connected to an outer face of the carrier by means of a duct which is formed in the carrier in one development. In this case, a hole is to be understood to be any type of recess which can be produced by drilling amongst other processes.

Another alternative contact area has moldings which form a turf structure, the distances between said moldings being approximately equal to or less than the average diameter of the conductive particles in at least one direction. As a result, when the carrier and the further carrier for the contact area and the mating contact area are joined, the adhesive comprising the conductive particles is pushed into said moldings which form a turf structure, wherein the binder of the adhesive can flow away to the outside, whereas the conductive particles remain in said structure.

This effect can be helped by selecting the shape of the conductive particles. For example, the conductive particles can have, for example, a hook or star shape.

The invention also relates to a device having a contact area which is arranged on a carrier, has been described in greater detail above and is connected to a mating contact area on a further carrier by means of an adhesive which contains conductive particles, wherein the mating contact area has a surface structure which is matched to the surface of the contact area and prevents conductive particles from flowing away.

These measures, which can be provided both individually and also in combination, have the effect that a sufficiently high number of conductive particles remains between the contact area and the mating contact area so that good electrical contact is made.

BRIEF DESCRIPTION OF THE SEVERAL VIEWS OF THE DRAWING

The invention will be described in greater detail below using exemplary embodiments with the aid of figures, in which FIG. 1 shows a connection of a contact area, which is arranged on a carrier, to a mating contact area, which is arranged on a further carrier, by means of an adhesive which contains conductive particles, according to the prior art, FIG. 2 shows a design of a contact area for connection to a mating contact area according to a first embodiment of the invention, FIG. 3 shows a design of a contact area for connection to a mating contact area according to a second embodiment of the invention, FIG. 4 shows a design of a contact area for connection to a mating contact area according to a third embodiment of the invention, and FIG. 5 shows an apparatus having a contact area and a patterned mating contact area.

DESCRIPTION OF THE INVENTION

Identical reference symbols are used for identical parts in the following description of FIGS. 2 to 5.

FIG. 2 shows a carrier 1 on which a contact area 2 is arranged, wherein this metallic contact area 2 can be produced, for example, by applying a solder or by etching from a copper lamination or by means of other conventional methods. An adhesive 5 which has conductive particles 6 is applied to the contact area 2. By joining the contact area 2 on the carrier 1 to a mating contact area 4 on a further carrier 3, this being schematically illustrated by a vertical arrow 8, the adhesive 5—illustrated by horizontal arrows 9, 9'—is pushed away to the sides.

In order to minimize the amount of conductive particles which are contained in the adhesive 5 flowing away, recesses 7—recesses which run perpendicularly to one another in the illustrated example of FIG. 2—are provided in the contact area 2 in an inventive manner, the width of said recesses advantageously being less than or virtually equal to the average diameter of the conductive particles 6, with the result that the adhesive 5 is pushed into the recesses and can flow away there, while the conductive particles 6 are retained and compressed in said recesses. In this way, good electrical contact can be established between the contact area 2 and the mating contact area 4 over a large surface area since a sufficient number of conductive particles 6 remain between the contact areas 2, 4.

The contact area 2 and likewise the mating contact area 4 too are advantageously designed such that a cavity is produced in their center by the surface being designed to run in a concave manner from a first edge 10 to the opposite edge 10' and possibly also from a second edge 10", which runs perpendicularly to the first edge 10, to the edge which is opposite said second edge. As a result, in addition to the recesses 7, conductive particles 6 are retained between the contact areas 2, 4 when the two carriers 1, 3 are joined.

FIG. 3 shows that a hollow space 11 is formed in the carrier 1 beneath the contact area 2, the binder of the adhesive 5 being pushed into said hollow space through holes 15 in the contact area 2, wherein the holes advantageously have a diameter which is approximately equal to or less than the average diameter of the conductive particles 6 at least in one direction, with the result that said conductive particles are not pushed into the cavity, but rather can collect on the surface of the contact area 2. In one development of the invention, the hollow space 11 can be connected to the surface of the carrier 1 by means of a duct 12, with the result that the binder of the adhesive 5 can be routed to the outside.

In addition to the holders 15, the described recesses 7 can likewise advantageously be provided. In addition, it may be advantageous to design the surface of the contact area 2 and possibly of the contact area 4 in the form of a cavity.

FIG. 4 shows a further embodiment of the design according to the invention of a contact area 2 which is arranged on a carrier 1 and, in this case, has moldings 13 which are arranged on the surface of the contact area 2 and which are arranged at a distance from one another in such a way that the binder of the adhesive 5 can flow away freely but a sufficient number of conductive particles 6 are retained by the moldings 13 so that said conductive particles can collect between the contact area 2 and the mating contact area 4 when the carrier 1 and the further carrier 3 are joined. In this case, the moldings 13 can have any shape and can be integrally formed with the contact area or else the retrofitted to said contact area.

According to FIG. 5, the surface structure 14 of the mating contact area 4 is advantageously designed in such a way that it contributes toward retaining the conductive particles 6 between the contact area 2 and the mating contact area 4. In this case, said surface structure can have either a corresponding roughness or corrugation, but also be of concave design or likewise have moldings which form a turf structure.

By virtue of the configurations of the contact area according to the invention, it is possible, in a simple manner, to establish good connections by means of an adhesive—for example an anisotropic conductive adhesive—together with good and reproducible conductivity. The surface structures of the contact area and the mating contact area can be generated both using mechanical and using chemical processes. By suitable selection of the shape of the conductive particles—for example a hook- or star shape—said conductive particles can be easily captured in the surface structure, in particular the turf structure, the contact area and possibly the mating contact area.

The invention claimed is:
1. A device, comprising:
 a carrier having a contact area for connection to a mating contact area on a further carrier;
 an adhesive including conductive particles with an average diameter, said adhesive for connecting said contact area of said carrier to the mating contact area on the further carrier;
 said contact area of said carrier having a surface with moldings extending from said surface, said moldings forming a turf structure, said moldings being spaced apart from each other by distances being approximately equal to or less than the average diameter of the conductive particles in at least one direction; and
 said conductive particles located in between said moldings extending from said surface of said contact area.

* * * * *